United States Patent
McNeil et al.

(10) Patent No.: US 7,528,468 B2
(45) Date of Patent: May 5, 2009

(54) CAPACITOR ASSEMBLY WITH SHIELDED CONNECTIONS AND METHOD FOR FORMING THE SAME

(75) Inventors: Andrew C. McNeil, Chandler, AZ (US); Dubravka Bilic, Scottsdale, AZ (US); Stephen R. Hooper, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 206 days.

(21) Appl. No.: 11/526,971
(22) Filed: Sep. 25, 2006

(65) Prior Publication Data

US 2008/0073760 A1 Mar. 27, 2008

(51) Int. Cl.
*H01L 23/552* (2006.01)

(52) U.S. Cl. .......... 257/659; 257/296; 257/297; 257/298; 257/300; 257/312; 257/313; 257/532; 257/E27.017; 257/E27.019; 257/E27.025; 257/E27.03; 257/E27.031

(58) Field of Classification Search ......... 257/296–313, 257/528, 531, 532, 533, 595–602, 923, 924, 257/E27.017, E27.019–E27.021, E27.023–E27.025, 257/E27.03–E27.035, E27.037–E27.038, 257/E27.041, E27.045, E27.047–E27.048, 257/E27.071, E27.09, E27.092–E27.093, 257/E27.095, E27.101, E27.114–E27.116, 257/E21.008–E21.021, E21.364; 438/171, 438/190, 210, 238–253, 329, 379, 387, 444, 438/901; 361/723, 766, 767, 773, 776, 813

See application file for complete search history.

(56) References Cited

U.S. PATENT DOCUMENTS

| 5,545,912 | A | 8/1996 | Ristic et al. |
| 6,453,749 | B1 | 9/2002 | Petrovic et al. |
| 6,472,243 | B2 | 10/2002 | Gogoi et al. |
| 2007/0215928 | A1* | 9/2007 | McLeod ................. 257/306 |

* cited by examiner

*Primary Examiner*—Jasmine J Clark
(74) *Attorney, Agent, or Firm*—Ingrassia, Fisher & Lorenz, P.C.

(57) ABSTRACT

A capacitor assembly (82) is formed on a substrate (20). The capacitor assembly a first conductive plate (38) and a second conductive plate (60) formed over the substrate such that the second conductive plate is separated from the first conductive plate by a distance. A conductive trace (40) is formed over the substrate that is connected to the first conductive plate and extends away from the capacitor assembly. A conductive shield (62) is formed over at least a portion of the conductive trace that is separated from the first and second conductive plates to control a fringe capacitance between the second conductive plate and the conductive trace.

20 Claims, 8 Drawing Sheets

US 7,528,468 B2

CAPACITOR ASSEMBLY WITH SHIELDED CONNECTIONS AND METHOD FOR FORMING THE SAME

FIELD OF THE INVENTION

The present invention generally relates to a microelectronic assembly and a method for forming a microelectronic assembly, and more particularly relates to a capacitor assembly with shielded connections.

BACKGROUND OF THE INVENTION

Integrated mechanical and circuit devices (i.e., integrated circuits and/or microelectromechanical (MEMS) devices) are formed on semiconductor substrates, or wafers. The wafers are then sawed into microelectronic dies (or "dice"), or semiconductor chips, with each die carrying a respective integrated circuit and/or MEMS component. Each semiconductor chip is mounted to a package or carrier substrate using either wirebonding or "flip-chip" connections. The packaged chip is then typically mounted to a circuit board, or motherboard, before being installed in a system, such as an electronic or a computing system.

Depending on the intended use of the semiconductor chip, one of the types of devices formed on the semiconductor substrate may be a capacitor. "On-chip" capacitors are often used on integrated circuit devices such as converters, radio frequency (RF) circuits, filters, and MEMS devices, such as pressure sensors and accelerometers. Such capacitors typically include two conductive plates separated by a gap (or a cavity) or an insulating material. Conductive traces, or runners, are also formed on the substrate to electrically connect each of the plates to an integrated circuit that may be located on the same die and is used to detect or calculate the capacitance between the two plates ($C_{sense}$).

However, often a fringe capacitance ($C_{fringe}$) between one of the conductive plates and the conductive traces is also detected by the integrated circuit. The detection of this fringe capacitance is particularly problematic when the capacitor is used as a pressure sensor and one of the conductive plates is exposed to a fluid, such as in a tire. The fluid in a tire is typically air but may also include, for example, water and oil. These different fluids have different dielectric constants, and when contact is made with a portion of the capacitor, the fringe capacitance between the conductive plate and the conductive trace may be changed dramatically because of the change in dielectric constant. This change in fringe capacitance can adversely affect the accuracy of the capacitive sensing capabilities of the assembly.

Accordingly, it is desirable to provide a capacitor assembly with a reduced and controlled fringe capacitance between the conductive plates and the conductive traces. In addition, it is desirable to minimize the cost of manufacturing a capacitor assembly with a reduced and controlled fringe capacitance. Furthermore, other desirable features and characteristics will become apparent from the subsequent detailed description and the appended claims, taken in conjunction with the accompanying drawings and the foregoing technical field and background.

BRIEF DESCRIPTION OF THE DRAWINGS

The various embodiments will hereinafter be described in conjunction with the following drawings, wherein like numerals denote like elements.

DETAILED DESCRIPTION OF THE INVENTION

The following detailed description is merely exemplary in nature and is not intended to limit the invention or application and uses of the invention. Furthermore, there is no intention to be bound by any expressed or implied theory presented in the preceding technical field, background, brief summary, or the following detailed description. It should also be noted that FIGS. 1-14 are merely illustrative and may not be drawn to scale.

FIGS. 1-14 illustrate an exemplary method for forming an electronic, or microelectronic, assembly that may include microelectromechanical system (MEMS) components. The assembly includes first and second conductive plates formed over a substrate to form a capacitor. The second conductive plate is separated from the first conductive plate by a distance. At least one conductive trace is formed over the substrate to electrically connect the conductive plates to an integrated circuit. A conductive shield is formed over the conductive trace interconnecting the first conductive plate and the integrated circuit. The conductive shield is electrically separated from the conductive plates and the conductive traces and controls a fringe capacitance between the second conductive plate and the first conductive trace.

Figure 1:
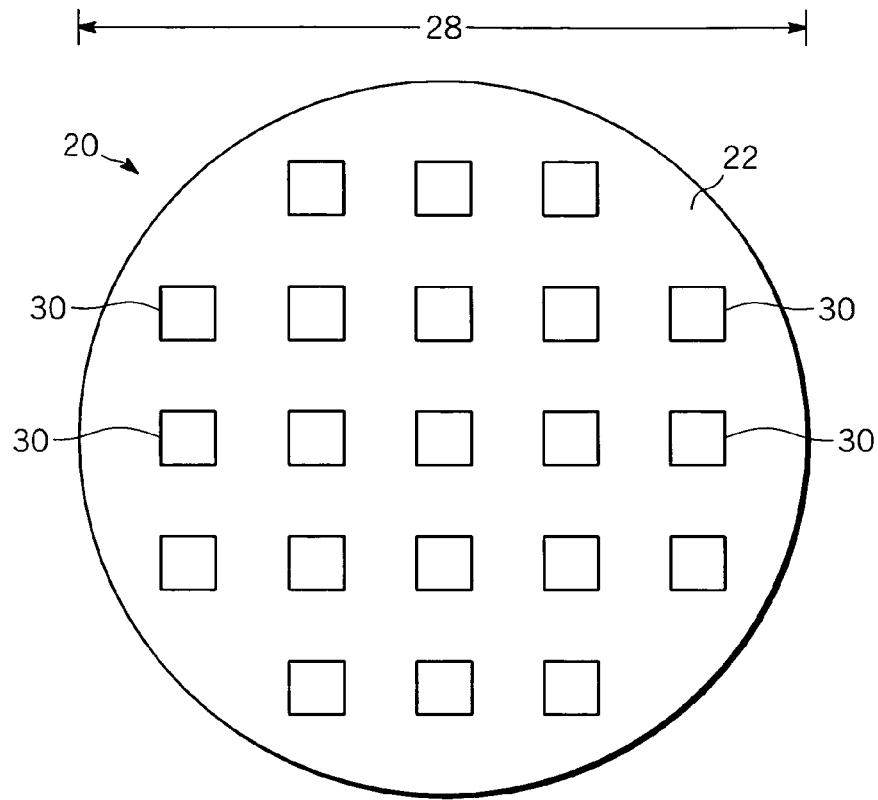
FIG. 1 is a top plan view of a semiconductor substrate.
Figure 2:
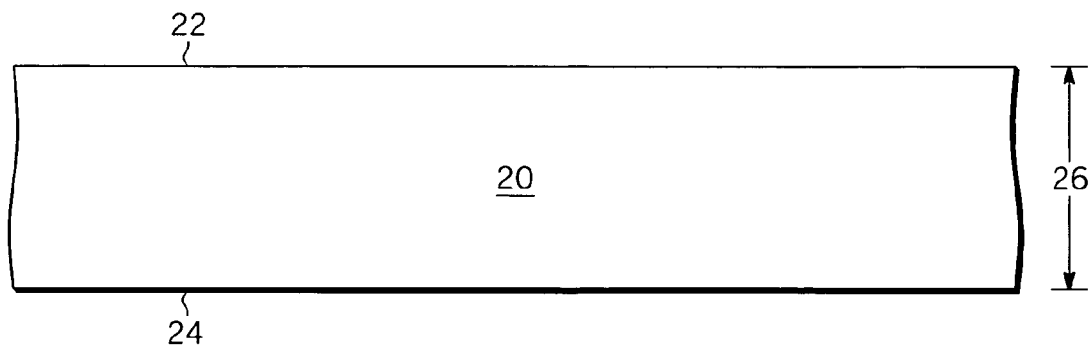
FIG. 2 is a cross-sectional side view of a portion of the semiconductor substrate of FIG. 1.

Referring to FIGS. 1 and 2, there is illustrated a semiconductor substrate 20. The semiconductor substrate 20 is made of a semiconductor material, such as gallium arsenide (GaAs), gallium nitride (GaN), or silicon (Si). The substrate 20 has an upper surface 22, a lower surface 24, and a thickness 26 of, for example, between approximately 300 and 1000 microns. The semiconductor material of the substrate 20 may be of a first conductivity type, or doped with a first dopant type (e.g., P-type). The substrate 20 may be a semiconductor wafer with a diameter 28 of, for example, approximately 150, 200, or 300 millimeters. As illustrated specifically in FIG. 1, the substrate 20 is divided into multiple dies 30, or "dice." It should be understood that the substrate 20 may also include various doped regions (e.g., buried regions and wells) formed therein which are not shown in FIGS. 1-14. Additionally, although the following process steps may be shown as being performed on only a small portion of the substrate 20, it should be understood that each of the steps may be performed on substantially the entire substrate 20, or multiple dice 30, simultaneously. Furthermore, although not shown, it should be understood that the processing steps described below may be facilitated by the deposition and removal of multiple additional processing layers, such as photoresist, as is commonly understood.

Figure 3:
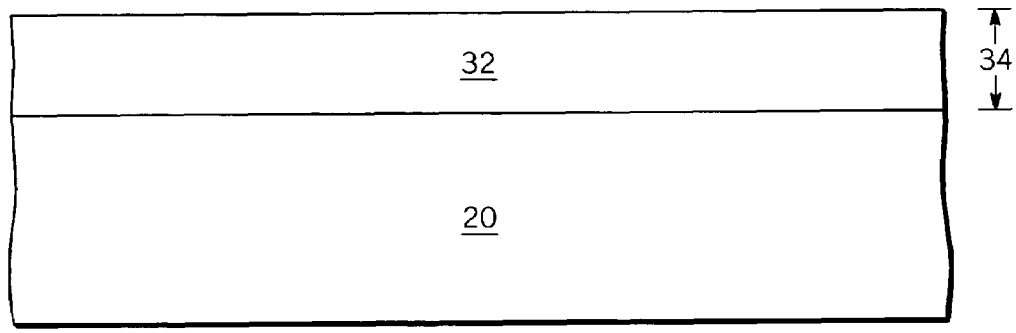
FIG. 3 is a cross-sectional side view of the semiconductor substrate of FIG. 2 with an insulating region formed thereon.

Referring to FIG. 3, an insulation region 32 is first formed over the upper surface 22 of the substrate 20. The insulation region 32 may be formed by etching a trench into the upper surface 22 of the substrate 20 and filling the trench with an insulating material, such as a field oxide (e.g., silicon dioxide ($SiO_2$)) deposited using chemical vapor deposition (CVD). In this way, the insulation region may be formed in a similar manner as a shallow trench isolation (STI) region, as is commonly understood. Although not shown, the insulation region has a width of, for example, between a few microns and several thousand microns, and a thickness 34 of, for example, between 3000 and 5000 angstroms (Å).

Figure 4:
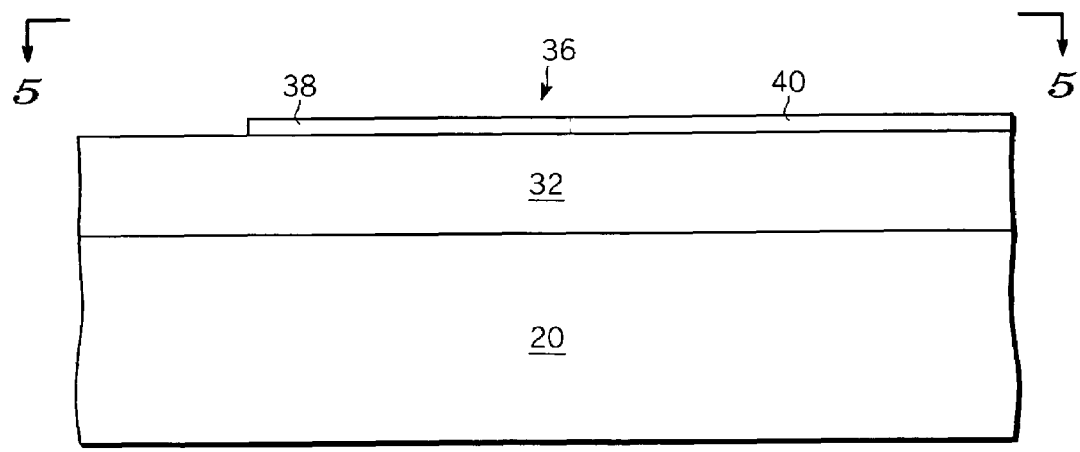
FIG. 4 is a cross-sectional side view of the semiconductor substrate of FIG. 3 with a lower conductive plate and a lower conductive trace formed over thereon.
Figure 5:
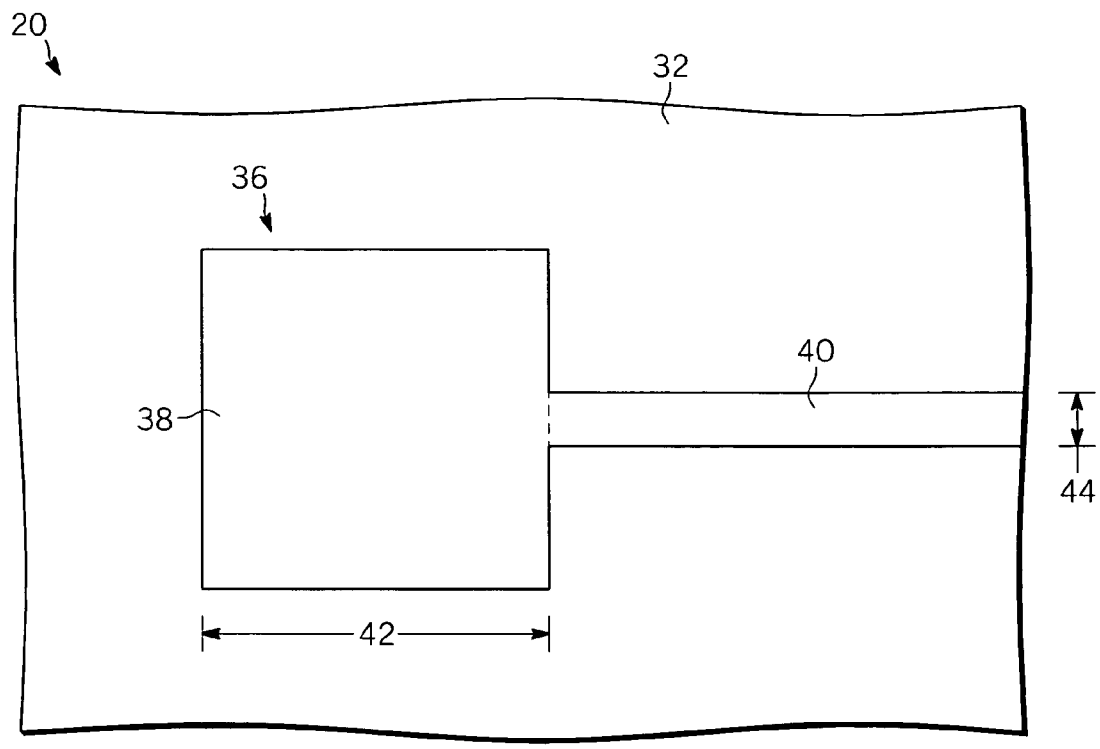
FIG. 5 is a top plan view of the semiconductor substrate of FIG. 4 taken along line 5-5.

As shown in FIGS. 4 and 5, a lower conductor 36 is then formed over the insulation region 32. The lower conductor is made of an electrically conductive material, such as N-type doped polycrystalline silicon, and has, for example, a thickness of between 1000 and 3000 Å. Although not specifically illustrated, the lower conductor 36 may be formed by depositing a layer of the conductive material (i.e., a lower conductive layer) over substantially the entire upper surface 22 of the substrate 20 and patterning (and/or etching), the layer such that only the lower conductor 36 remains, as shown in FIG. 5, and includes a lower (or first) conductive plate 38 and a lower (or first) conductive trace 40. As such, the lower conductive trace 40 is electrically connected to, and may be formed during the same processing steps, as the lower conductive plate 38. In the embodiment shown in FIG. 5, the lower conductive plate 38 is substantially square with a side length 42 of, for example, between 15 and 35 microns, and the lower conductive trace 40 has a width 44 of, for example, between 5 and 15 microns.

Figure 6:
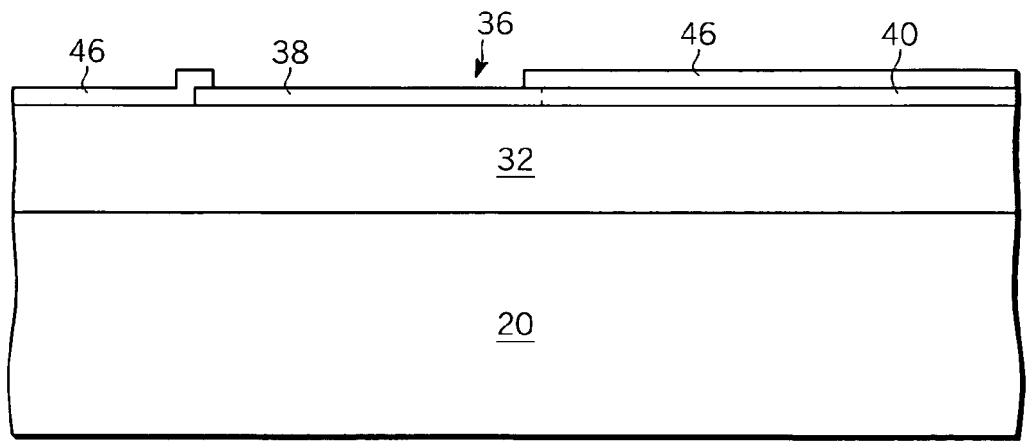
FIG. 6 is a cross-sectional side view of the semiconductor substrate of FIG. 4 with an insulating layer formed thereon.

An electrically insulating layer 46 is then formed over the insulating region 32 and the lower conductor 36, as shown in FIG. 6. The insulating layer 46, in one embodiment, is made of silicon nitride (SiN), formed using low pressure chemical vapor deposition (LPCVD), and has a thickness of between 3000 and 7000 Å. Still referring to FIG. 6, the insulating layer 46 is patterned and/or etched to leave a central portion (e.g., a majority of an upper surface) of the lower conductive plate 38 exposed.

Figure 7:
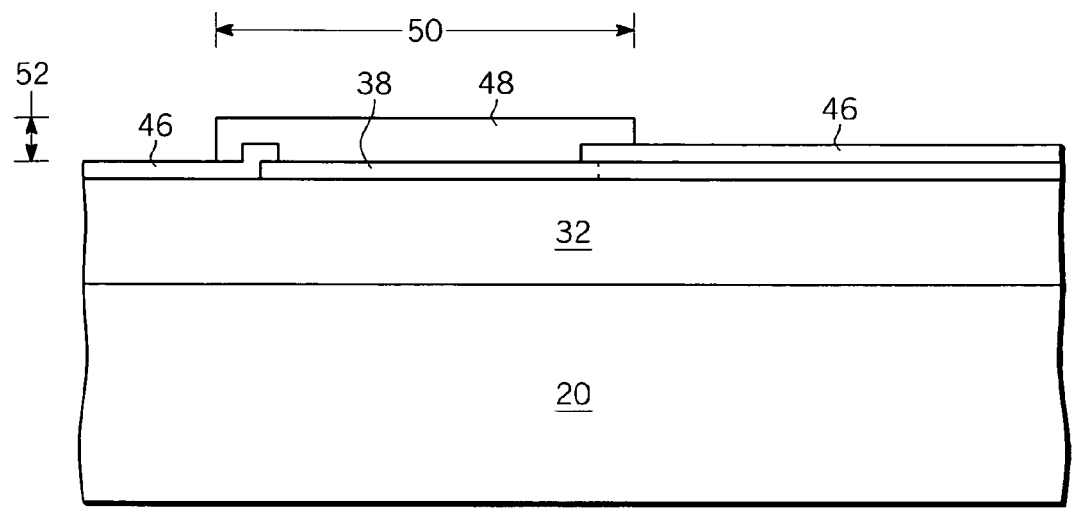
FIG. 7 is a cross-sectional side view of the semiconductor substrate of FIG. 6 with a sacrificial body formed thereon.

Referring to FIG. 7, a sacrificial body 48 (i.e., made of a sacrificial material) is next formed partially over the insulating layer 46 and the central portion of the lower conductive plate 38. In one embodiment, the sacrificial body 48 is made of boro-phospho-silicate glass (BPSG) and formed using CVD. Although not illustrated, the sacrificial body 48 may be formed by forming a layer of the sacrificial material over the entire substrate 20 and patterning and/or etching the layer such that the sacrificial body 48 remains. The sacrificial body 48 has, for example, a width 50 of between 20 and 80 microns and a thickness 52 of between 0.3 and 1.5 microns.

Figure 8:
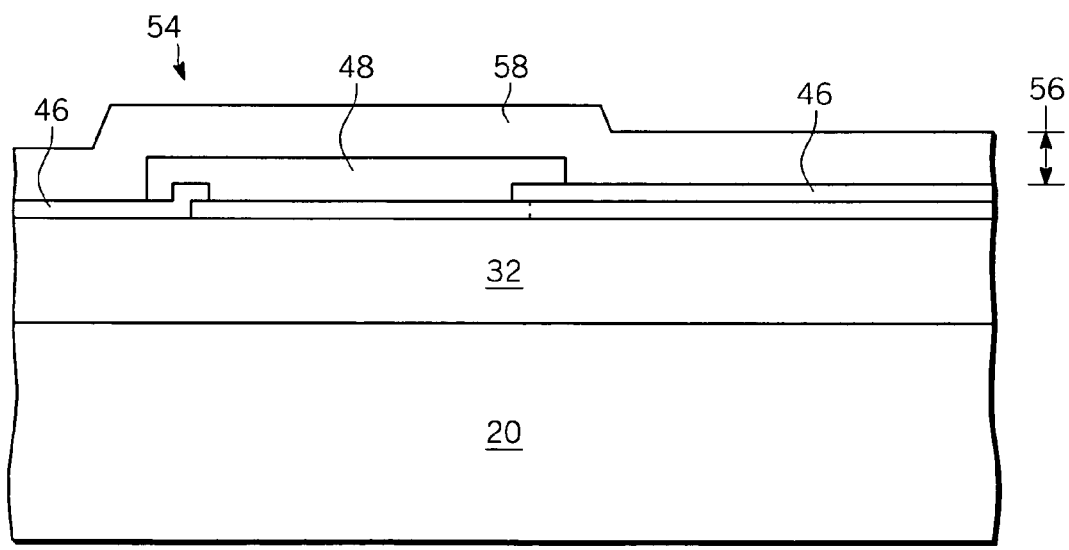
FIG. 8 a cross-sectional side view of the semiconductor substrate of FIG. 7 with an upper conductive layer formed thereon.

Referring to FIG. 8, an upper conductive layer 54 is then formed over the sacrificial body 48 and the insulating layer 46. In one embodiment, the upper conductive layer 54, similar to the lower conductive layer, is made of polycrystalline silicon, formed using CVD, and has a thickness 56 of, for example, between 1 and 3 microns. As shown, the upper conductive layer 54 includes a raised portion 58 resulting from the sacrificial body 48.

Figure 9:
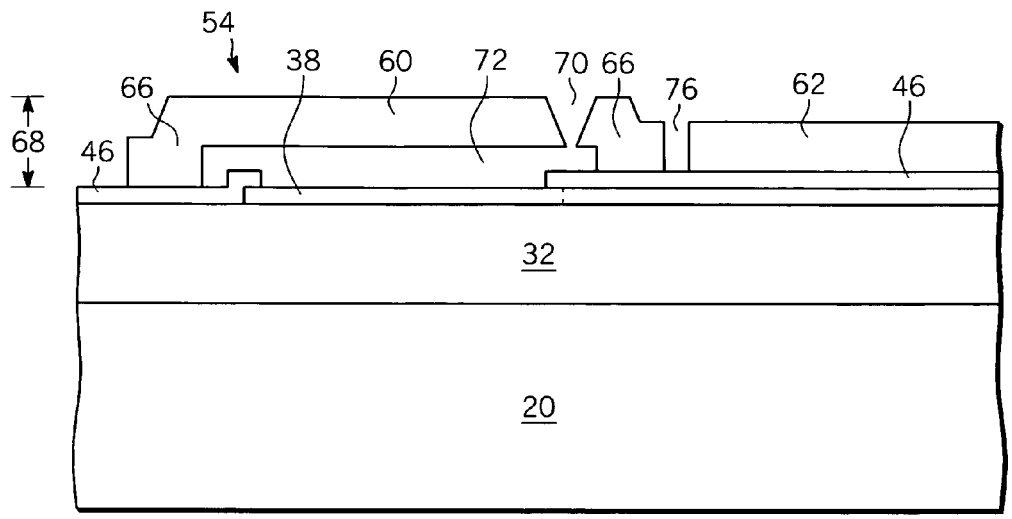
FIG. 9 is a cross-sectional side view of the semiconductor substrate of FIG. 8 after the upper conductive layer has been etched to form an upper conductive plate and a conductive shield.
Figure 10:
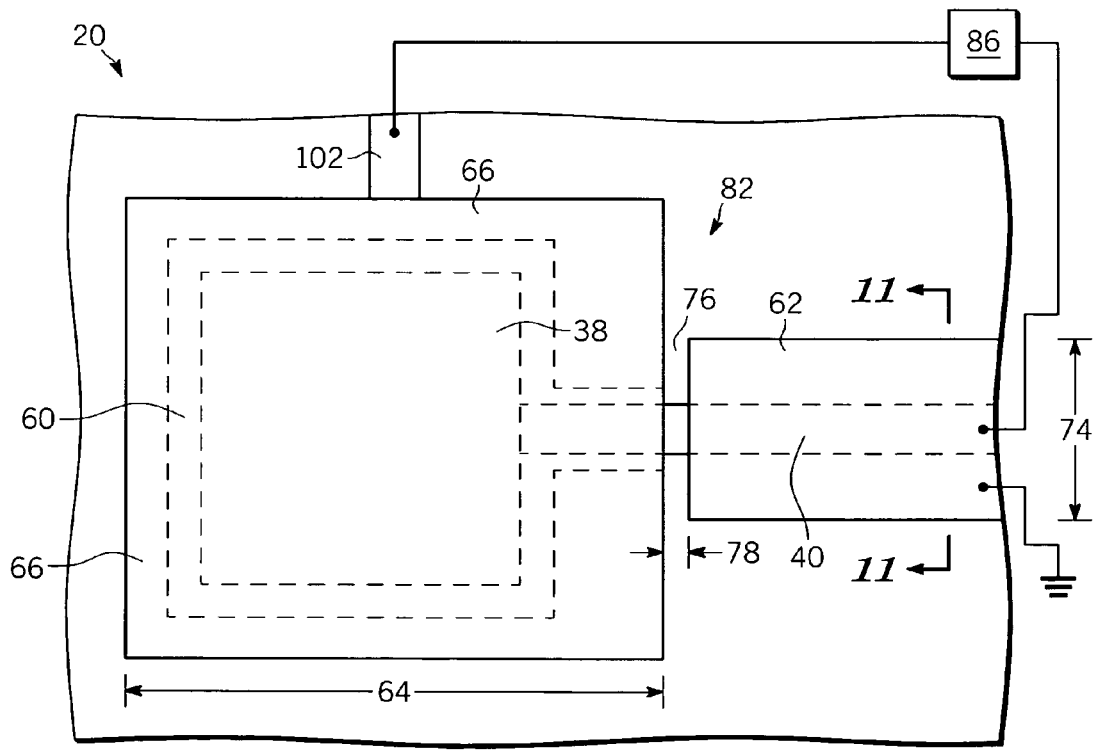
FIG. 10 is a top plan schematic view of the substrate of FIG. 9, along with an integrated circuit formed on the substrate, illustrating an electronic assembly according to one embodiment of the present invention.

As illustrated in FIGS. 9 and 10, the upper conductive layer 54 is then patterned and/or etched to form an upper (or second) conductive plate 60 and a conductive shield 62. The upper conductive plate, in the depicted embodiment, is substantially square with a side length 64 of, for example, between 40 and 60 microns, and is centered over the lower conductive plate 38, as shown in FIG. 10. The upper conductive plate 60 includes side walls (or side wall members) 66 extending downwards from outer portions thereof to the insulating layer 46 around a periphery of the lower conductive plate 38 such that the upper conductive plate 60 extends a height 68 above the insulating layer 46 of, for example, between 2 and 4 microns. A side wall 66 adjacent to the lower conductive trace 40 has an opening therein through which the lower conductive trace 40 passes with an insulating body (i.e., a portion of the insulating layer 46) insulating the lower conductive trace 40 from the upper conductive plate 60.

Referring specifically to FIG. 9, during the patterning and/or etching of the upper conductive layer 54, a release opening 70 is also formed through an upper portion of the upper conductive plate 60 to expose at least a portion of the sacrificial body 48 (see FIG. 8). Although not specifically illustrated, the sacrificial body 48 is then removed using, for example, an isotropic etching process that is performed through the release opening 70. In one embodiment, the isotropic etching is carried out by exposing the sacrificial body to a mixture of hydrofluoric (HF) and acetic acids through the release opening 70. As the sacrificial body 48 is removed, a cavity 72 is formed between the lower conductive plate 38 (as well as adjacent portions of the insulating layer 46) and the upper conductive plate 60. The cavity 72 thus has dimensions similar to those of the sacrificial body 48.

Figure 11:
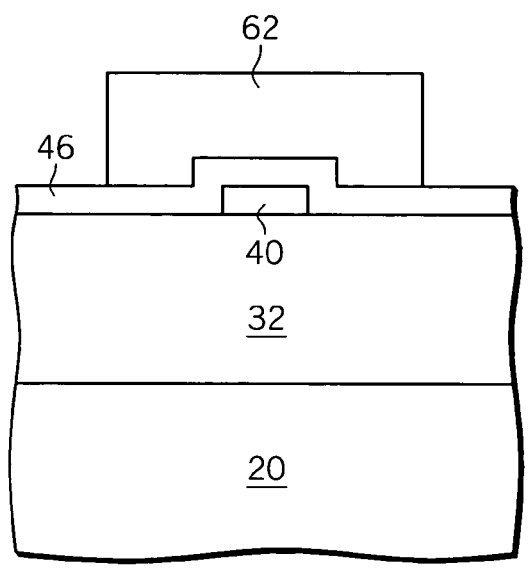
FIG. 11 is a cross-sectional side view of the substrate of FIG. 10 taken along line 11-11.

Referring now to FIG. 10 in combination with FIG. 11, the conductive shield 62 is centered over the lower conductive trace 40 and has a width 74 of, for example, between 10 and 30 microns. Preferably, the width 74 of the conductive shield 62 is greater than the width 44 of the lower trace 40. As shown specifically in FIG. 11, the conductive shield 62 may be formed to at least partially "wrap-around" the lower conductive trace 40 and/or a raised portion of the insulating layer 46. The conductive shield 62 may cover, for example between greater than 50% to substantially all of the lower conductive trace 40, and may be at least partially positioned between the upper conductive plate 60 and the lower conductive trace 40.

Referring once again to FIGS. 9 and 10, during the patterning and/or etching of the upper conductive layer 54, a gap 76 with a width 78 of, for example, between 0.5 and 3 microns, is formed between the upper conductive plate 60 and the conductive shield 62 such that the upper conductive plate 60 and the conductive shield 62 are electrically separated. Thus, a first portion of the lower conductive trace 40 may be covered by the upper conductive plate 60, a second portion of the lower conductive trace 40 may be covered by the conductive shield 62, and a third portion (interconnecting the first and second portions) of the lower conductive trace 40 may lie adjacent to the gap 76.

Figure 12:
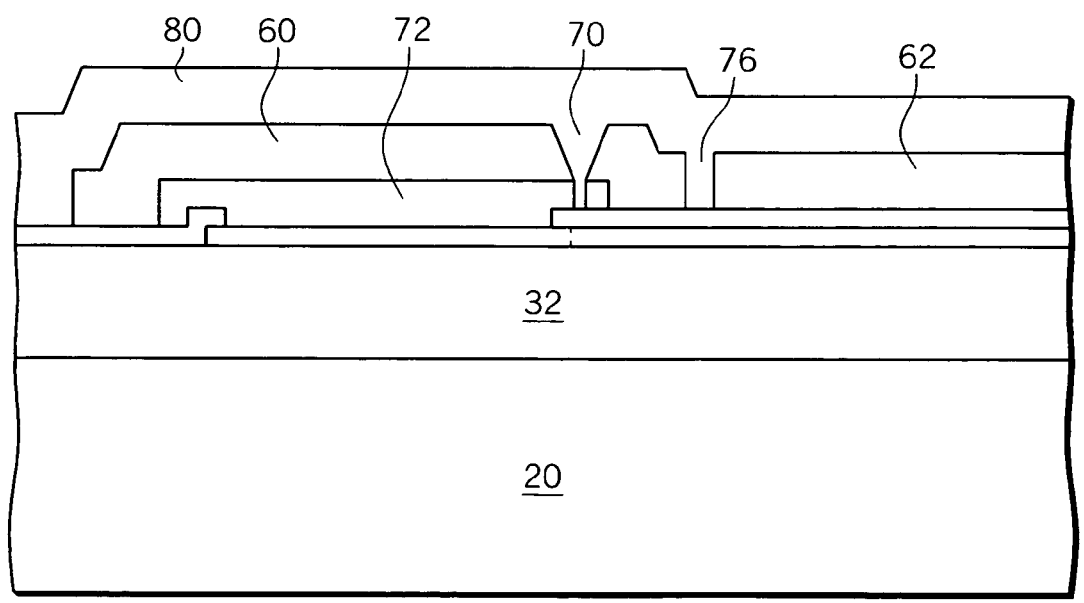
FIG. 12 is a cross-sectional side view of the semiconductor substrate of FIG. 9 with a sealing layer formed thereon.

Next, as illustrated in FIG. 12, a sealing (and/or insulating) layer 80 is formed over the upper conductive plate 60, and conductive shield 62, and within the gap 76. In one embodiment, the sealing layer 80 is made of tetraethylorthosilicate (TEOS) and formed using plasma enhanced chemical vapor deposition (PECVD) to a thickness of, for example, between 2 and 3 microns. As shown, some of the material of the sealing layer 80 fills the release opening 70 so that the cavity 72 is sealed. As will be appreciated by one skilled in the art, the formation of the sealing/insulating layer 80 may be performed in a controlled atmosphere in order to achieve specific atmospheric conditions (e.g., a vacuum) within the cavity 72 after the release opening 70 is sealed.

Figure 13:
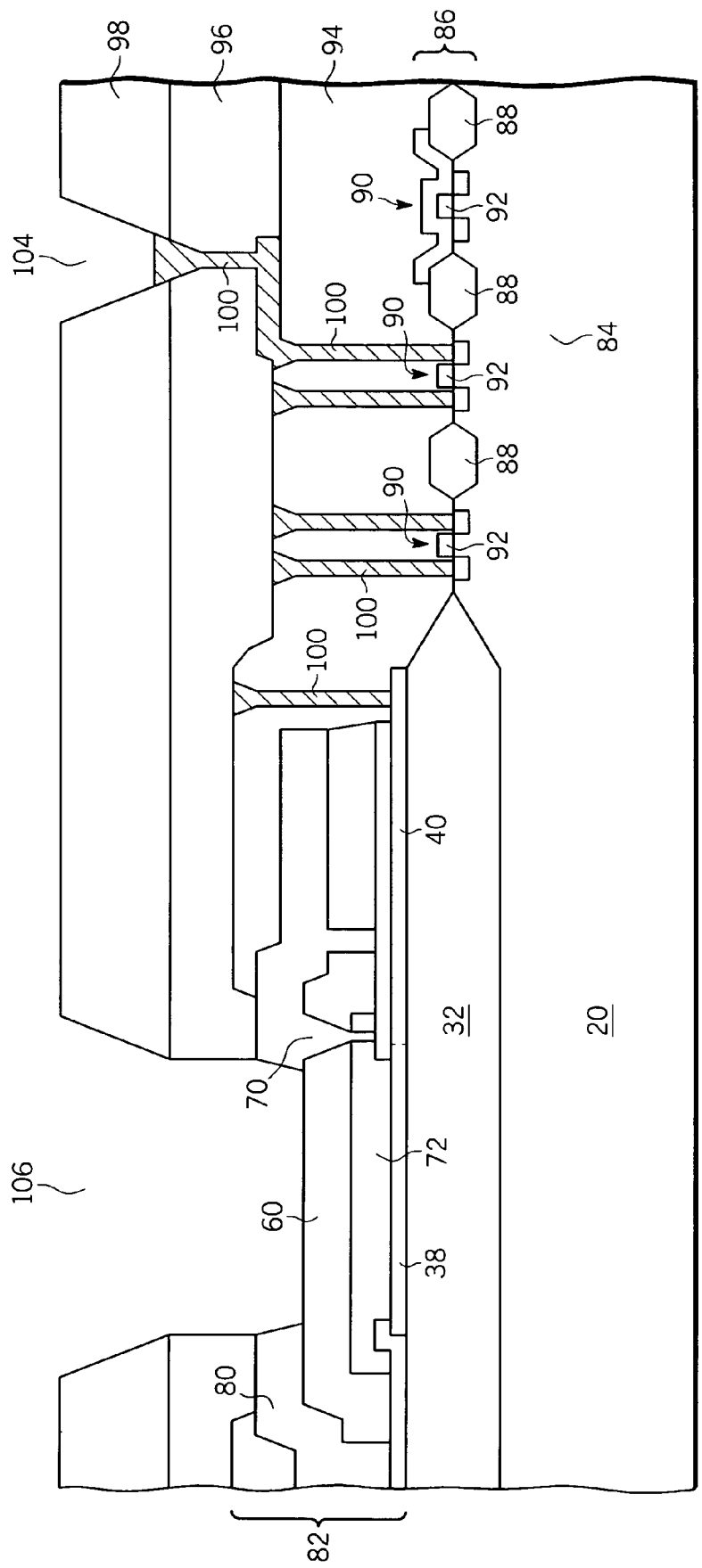
FIG. 13 is an expanded cross-sectional side view of the semiconductor substrate of FIG. 12 further illustrating the integrated circuit of FIG. 10 and a build up layer formed thereon.

FIG. 13 illustrates an expanded view of an exemplary embodiment of the substrate 20. As shown, the components formed over the insulating region 32, as described above, may form a capacitor assembly 82, or in the particular embodiment illustrated, a capacitive pressure sensor. The substrate 20 also includes an integrated circuit region 84 on a side of the insulating region 32 over which an integrated circuit 86 is formed. The integrated circuit 86 includes multiple STI regions 88 separating multiple semiconductor devices 90 (e.g., transistors). Although not specifically illustrated, at least some of the components of the integrated circuit 86 may be formed during the same processing steps that are used to form some of the components of the capacitor assembly 82. In one embodiment, the semiconductor devices 90 include gate electrodes 92 which are formed during the processing steps described above used to form the lower conductive plate 38 and lower conductive trace 40, and are thus made of the same material as the lower conductive plate 38 and the lower conductive trace 40 (e.g., polycrystalline silicon).

Still referring to FIG. 13, after the formation of the capacitor assembly 82 and the integrated circuit 86, a "build up" (or "backend processing") layer is formed over the substrate 20. The build up layer includes various insulating layers 94, 96, and 98 (e.g., inter-layer dielectrics (ILD)) and conductors 100 (e.g., through-vias and lines) formed over the capacitor assembly 82 and the integrated circuit 86. The insulating layers 94, 96, and 98 may be, for example, made of silicon oxide (SiO2), silicon nitride (SiN), TEOS, and/or borophosphosilicate tetraethylorthosilicate (BPTEOS) and formed using CVD, LPCVD, and/or PECVD. The conductors 100 may be, for example, made of copper, aluminum, and/or tungsten and formed using plating and/or sputtering.

Referring again to FIG. 10, an upper (or second) conductive trace 102 is also formed, during either the formation of the capacitor assembly 82 and/or the build up layer, and is electrically connected to the upper conductive plate 60 of the capacitor assembly 82. As shown schematically in FIG. 10, the lower conductive plate 38 and the upper conductive plate 60 are electrically connected to the integrated circuit 86 through the conductive traces 40 and 102, which extend away from the capacitor assembly 82 over the substrate 20 (shown in FIG. 13).

As shown in FIG. 13, a contact opening (or multiple contact openings) 104 and a diaphragm opening 106 are then formed through the build up layer. The contact opening 104 extends through the build up layer to a conductor 100 within an upper insulating layer 96, and the diaphragm opening 106 is positioned above the capacitor assembly 82 and extends through the insulating layers 94, 96, and 98, as well as the sealing layer 80 to expose the upper conductive plate 60. However, in the depicted embodiment, the formation of the diaphragm opening 106 does not expose the release opening 70 through the upper conductive plate 60. As such, the cavity 72 remains sealed.

The formation of the build up layer may substantially complete the formation of an electronic, or microelectronic (and/or MEMS) assembly, according to one embodiment of the present invention. After final processing steps, the substrate 20 may be sawed into the individual microelectronic dice 30 (shown in FIG. 1), or semiconductor chips, packaged, and installed in various systems, such as a vehicle, in which it is desired to monitor a pressure (e.g., tire pressure) of a medium such as a gas (e.g., air) or a liquid (e.g., brake fluid).

Referring to FIGS. 10 and 13 in combination, during operation, the integrated circuit 86 monitors the capacitance between lower conductive plate 38 and the upper conductive plate 60, while the conductive shield 62 is connected to a ground (or controlled reference voltage). As will be appreciated by one skilled in the art, the capacitance between the lower and upper conductive plates 38 and 60 is dependent on the distance therebetween. As such, a first pressure applied to the upper conductive plate 60 causes the upper conductive plate 60 to be positioned a first distance from the lower conductive plate 38 causing the integrated circuit 86 to detect a first capacitance between the conductive plates 38 and 60. If the pressure applied to the upper conductive plate 60 either increases or decreases (i.e., to a second pressure), the upper conductive plate 60 moves (e.g., bends or deflects towards and away from the lower conductive plate 38) to a second position a second distance from the lower conductive plate. Thus, the integrated circuit 86 detects a second capacitance between the conductive plates 38 and 60. In one embodiment, the integrated circuit constantly monitors the capacitance between the conductive plates 38 and 60 and generates an output signal (e.g., a direct current signal and/or a digital signal) representative thereof. The conductive shield 62 reduces and controls the fringe, or parasitic, capacitance between the upper conductive plate and the lower conductive trace.

One advantage of the electronic assembly described above is that because the conductive plate controls and reduces the fringe capacitance between the upper conductive plate and the lower conductive trace, any contaminants, such as water or oil, that come into contact with the upper conductive plate, or any portion of the capacitor assembly, will have a reduced, and more predictable, effect on the total capacitance that is sensed by the integrated circuit. As a result, the accuracy of the capacitor assembly is improved. Another advantage is that the conductive shield may be formed using standard semiconductor processing steps (e.g., complimentary metal oxide semiconductor (CMOS)), and in particular, may be formed during the same processing steps used to form other components (e.g., the upper conductive plate). Thus, any additional manufacturing costs due to the formation of the conductive shield are minimized.

Figure 14:
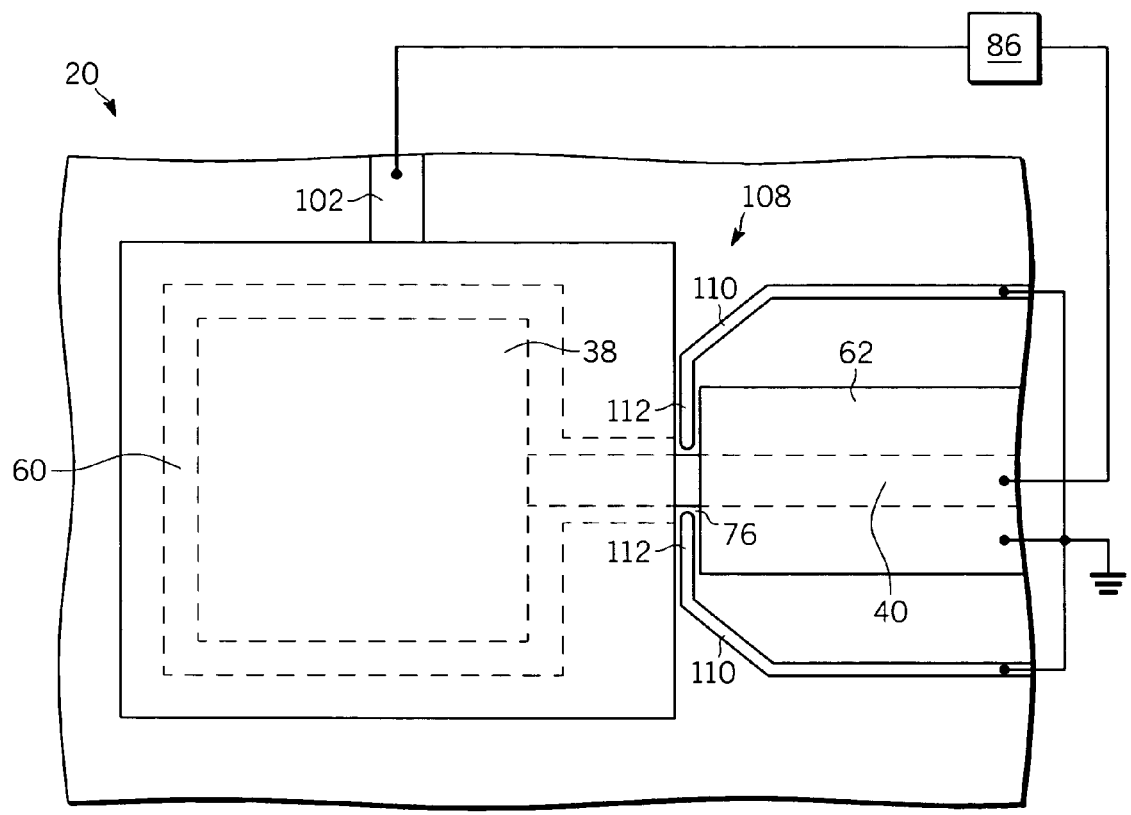
FIG. 14 is a top plan schematic view of an electronic assembly according to another embodiment of the present invention.

FIG. 14 illustrates a capacitor assembly 108 according to another embodiment of the present invention. The capacitor assembly 108 may be similar to the capacitor assembly 82 illustrated in FIG. 10, however, conductive shield members 110, or side shields, may be formed over the substrate 20 on opposing sides of the lower conductive trace 40 and the conductive shield 62. The conductive shield members 110 have end portions 112 that are adjacent to, and extend within, the gap 76 between the upper conductive plate 60 and the conductive shield 62. The conductive shield members 110 may be made of polycrystalline silicon, and although not specifically illustrated, may be formed during the forming of the lower conductive plate 38 and the lower conductive trace 40 (i.e., during the same semiconductor processing steps). As shown in FIG. 14, the conductive shield members 110 are electrically connected to the conductive shield 62 and/or the ground to which the conductive shield is connected.

A further advantage of the embodiment illustrated in FIG. 14 is that because of the formation of the conductive shield members, any electrical field between the upper conductive plate 60 and the lower conductive trace 40 is confined to a reduced space. As a result, the fringe capacitance between the upper conductive plate 60 and the lower conductive trace 40 is further reduced. Thus, the accuracy of the capacitor assembly 108 is even further improved.

Other embodiments may include different sizes and shapes of capacitors, besides the square-plate capacitor shown. There may also be variations in the processing steps shown. It should also be understood that the capacitor assembly described above, and in particular the conductive shield, may be utilized in microelectronic assemblies other than capacitive pressure sensors such as converters, radio frequency (RF) circuits, filters, and accelerometers.

The invention provides a microelectronic assembly including a substrate, a first conductive plate formed over the substrate, a second conductive plate formed over the substrate such that the second conductive plate is separated from the first conductive plate by a distance, the first and second conductive plates jointly forming a capacitor, a conductive trace formed over the substrate being connected to the first conductive plate and extending away from the capacitor, and a conductive shield formed over at least a portion of the conductive trace and being separated from the first and second conductive plates to control a fringe capacitance between the second conductive plate and the conductive trace.

At least a portion of the conductive shield may be positioned between the second conductive plate and the conductive trace, and the conductive shield may be formed over at least 50% of the conductive trace.

The microelectronic assembly may also include at least one semiconductor device formed over the substrate. The conductive trace may interconnect the first conductive plate and the at least one semiconductor device.

At least a portion of the second conductive plate may be moveable between first and second positions such that the distance between the first and second conductive plates is a first distance when the second conductive plate is in the first position and a second distance when the second conductive plate is in the second position.

The microelectronic assembly may also include a second conductive trace formed over the substrate interconnecting the second conductive plate and the at least one semiconductor device. The second conductive plate may be formed over the first conductive trace such that the first conductive plate is positioned between the substrate and the second conductive plate. The conductive shield may be formed over the conductive trace such that the conductive trace is positioned between the substrate and the conductive shield.

A gap may be defined between the conductive shield and the second conductive plate. The microelectronic assembly may also include first and second conductive shield members formed on opposing sides of the conductive trace adjacent to the gap. The conductive shield members may be electrically connected to the conductive shield.

The microelectronic assembly may also include an insulating material between the conductive trace and the conductive shield and within the gap between the conductive shield and the second conductive plate. The second conductive plate may include at least one side wall member extending therefrom around a periphery of the first conductive plate such that a cavity is formed above and on opposing sides of the first conductive plate between the first conductive plate and the second conductive plate. The at least one side wall member may have an opening therethough. The conductive trace may extend through the opening. The microelectronic assembly may also include an insulating body between the conductive trace and the at least one side wall member.

The at least one semiconductor device may include an integrated circuit formed over the substrate. The integrated circuit may be configured to generate a signal representative of a first capacitance when the second conductive plate is in the first position and a second capacitance when the second conductive plate is in the second position.

The invention also provides a capacitive pressure sensor including a substrate, a first conductive plate formed over the substrate, a second conductive plate formed over the substrate and the first conductive plate such that the second conductive plate is moveable between first and second positions, the first and second conductive plates jointly forming a capacitor and being separated by a first distance when the second conductive plate is in the first position and being separated by a second distance when the second plate is in the second position, a first conductive trace formed over the substrate having first and second portions, the first portion of the first conductive trace being connected to the first conductive plate, a second conductive trace formed over the substrate having first and second portions, the first portion of the second conductive trace being connected to the second conductive plate, an integrated circuit formed over the substrate being connected to the second portion of the first conductive trace and the second portion of the second conductive trace such that the integrated circuit is electrically coupled to the first and second conductive plates, the integrated circuit being configured to generate a signal representative of a first capacitance when the second conductive plate is in the first position and a second capacitance when the second conductive plate is in the second position, and a conductive shield formed over at least a portion of the first conductive trace being electrically separated from the first and second conductive plates to control a fringe capacitance between the second conductive plate and the first conductive trace.

The second conductive plate and the conductive shield may include a selected material. The first conductive trace may also include a third portion interconnecting the first and second portions of the first conductive trace. A gap may be defined between the conductive shield and the second conductive plate adjacent to the third portion first conductive trace. The first portion of the first conductive trace may be positioned between the substrate and the second conductive plate. The conductive shield may cover substantially all of the second portion of the first conductive trace.

The capacitive pressure sensor may also include an insulating material between the first conductive trace and the conductive shield and within the gap between the conductive shield and the second conductive plate. The second conductive plate may include at least one side wall member extending therefrom around a periphery of the first conductive plate such that a cavity is formed above and on opposing sides of the first conductive plate between the first conductive plate and the second conductive plate. The at least one side wall member may have an opening therethough. The conductive trace may extend through the opening. The capacitive pressure sensor may also include an insulating body between the conductive trace and the at least one side wall member.

The capacitive pressure sensor may also include first and second conductive shield members formed on opposing sides of the first conductive trace adjacent to the gap. The conductive shield members may be electrically connected to the conductive shield and separated from the first conductive trace.

The invention further provides a method for forming a microelectronic assembly. A first conductive plate is formed over a substrate. A second conductive plate is formed over the substrate and the first conductive plate such that the second conductive plate is moveable between first and second positions. The first and second conductive plates jointly form a capacitor and are separated by a first distance when the second conductive plate is in the first position and are separated by a second distance when the second plate is in the second position. A conductive trace is formed over the substrate connected to the first conductive plate and extending away from the capacitor. A conductive shield is formed over at least a portion of the conductive trace and separated from the first and second conductive plates to control a fringe capacitance between the second conductive plate and the conductive trace.

The formation of the first conductive plate and the conductive trace may occur substantially simultaneously. The first conductive plate and the conductive trace may include a selected material. The formation of the second conductive plate and the conductive shield may occur substantially simultaneously. The second conductive plate and the conductive shield may include the selected material.

A gap may be defined between the second conductive plate and the conductive shield. First and second conductive shield members may also be formed on opposing sides of the conductive trace adjacent to the gap. The conductive shield members may be electrically connected to the conductive shield.

A second conductive trace may be formed over the substrate connected to the second conductive plate and extending away from the capacitor. An integrated circuit may be formed over the substrate connected the first conductive trace and the second conductive trace such that the integrated circuit is electrically coupled to the first and second conductive plates. The integrated circuit may be configured to generate a signal representative of a first capacitance when the second conductive plate is in the first position and a second capacitance when the second conductive plate is in the second position.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A microelectronic assembly comprising:
   a substrate;
   a first conductive plate formed over the substrate;
   a second conductive plate formed over the substrate such that the second conductive plate is separated from the first conductive plate by a distance, the first and second conductive plates jointly forming a capacitor;
   a conductive trace formed over the substrate being connected to the first conductive plate and extending away from the capacitor; and
   a conductive shield formed over at least a portion of the conductive trace and being separated from the first and second conductive plates to control a fringe capacitance between the second conductive plate and the conductive trace.

2. The microelectronic assembly of claim 1, wherein at least a portion of the conductive shield is positioned between the second conductive plate and the conductive trace and the conductive shield is formed over at least 50% of the conductive trace.

3. The microelectronic assembly of claim 2, further comprising at least one semiconductor device formed over the substrate, the conductive trace interconnecting the first conductive plate and the at least one semiconductor device.

4. The microelectronic assembly of claim 3, wherein at least a portion of the second conductive plate is moveable between first and second positions such that the distance between the first and second conductive plates is a first distance when the second conductive plate is in the first position and a second distance when the second conductive plate is in the second position.

5. The microelectronic assembly of claim 4, further comprising a second conductive trace formed over the substrate interconnecting the second conductive plate and the at least one semiconductor device.

6. The microelectronic assembly of claim 5, wherein the second conductive plate is formed over the first conductive trace such that the first conductive plate is positioned between the substrate and the second conductive plate and the conductive shield is formed over the conductive trace such that the conductive trace is positioned between the substrate and the conductive shield.

7. The microelectronic assembly of claim 6, wherein a gap is defined between the conductive shield and the second conductive plate and further comprising first and second conductive shield members formed on opposing sides of the conductive trace adjacent to the gap, the conductive shield members being electrically connected to the conductive shield.

8. The microelectronic assembly of claim 7, further comprising an electrically insulating material between the conductive trace and the conductive shield and within the gap between the conductive shield and the second conductive plate.

9. The microelectronic assembly of claim 8, wherein the second conductive plate comprises at least one side wall member extending therefrom around a periphery of the first conductive plate such that a cavity is formed above and on opposing sides of the first conductive plate between the first conductive plate and the second conductive plate, the at least one side wall member having an opening therethough, the conductive trace extending through the opening, and further comprising an electrically insulating body between the conductive trace and the at least one side wall member.

10. The microelectronic assembly of claim 7, wherein the at least one semiconductor device comprises an integrated circuit formed over the substrate, the integrated circuit being configured to generate a signal representative of a first capacitance when the second conductive plate is in the first position and a second capacitance when the second conductive plate is in the second position.

11. A capacitive pressure sensor comprising:
    a substrate;
    a first conductive plate formed over the substrate;
    a second conductive plate formed over the substrate and the first conductive plate such that the second conductive plate is moveable between first and second positions, the first and second conductive plates jointly forming a capacitor and being separated by a first distance when the second conductive plate is in the first position and being separated by a second distance when the second plate is in the second position;

a first conductive trace formed over the substrate having first and second portions, the first portion of the first conductive trace being connected to the first conductive plate;

a second conductive trace formed over the substrate having first and second portions, the first portion of the second conductive trace being connected to the second conductive plate;

an integrated circuit formed over the substrate being connected to the second portion of the first conductive trace and the second portion of the second conductive trace such that the integrated circuit is electrically coupled to the first and second conductive plates, the integrated circuit being configured to generate a signal representative of a first capacitance when the second conductive plate is in the first position and a second capacitance when the second conductive plate is in the second position; and a conductive shield formed over at least a portion of the first conductive trace being electrically separated from the first and second conductive plates to control a fringe capacitance between the second conductive plate and the first conductive trace.

12. The capacitive pressure sensor of claim 11, wherein the second conductive plate and the conductive shield comprise a selected material.

13. The capacitive pressure sensor of claim 12, wherein the first conductive trace further comprises a third portion interconnecting the first and second portions of the first conductive trace, a gap is defined between the conductive shield and the second conductive plate adjacent to the third portion first conductive trace, the first portion of the first conductive trace is positioned between the substrate and the second conductive plate, and the conductive shield covers substantially all of the second portion of the first conductive trace.

14. The capacitive pressure sensor of claim 13, further comprising an electrically insulating material between the first conductive trace and the conductive shield and within the gap between the conductive shield and the second conductive plate, and wherein the second conductive plate comprises at least one side wall member extending therefrom around a periphery of the first conductive plate such that a cavity is formed above and on opposing sides of the first conductive plate between the first conductive plate and the second conductive plate, the at least one side wall member having an opening therethough, the conductive trace extending through the opening, and further comprising an electrically insulating body between the conductive trace and the at least one side wall member.

15. The capacitive pressure sensor of claim 14, further comprising first and second conductive shield members formed on opposing sides of the first conductive trace adjacent to the gap, the conductive shield members being electrically connected to the conductive shield and separated from the first conductive trace.

16. A microelectronic assembly comprising:

a substrate;

at least one semiconductor device formed over the substrate;

a first conductive plate formed over the substrate;

a second conductive plate formed over the substrate such that the second conductive plate is separated from the first conductive plate by a distance, the first and second conductive plates jointly forming a capacitor;

a conductive trace formed over the substrate, the conductive trace interconnecting the first conductive plate and the at least one semiconductor device and extending away from the capacitor; and a conductive shield formed over at least a portion of the conductive trace and being separated from the first and second conductive plates to control a fringe capacitance between the second conductive plate and the conductive trace, at least a portion of the conductive shield being positioned between the second conductive plate and the conductive trace.

17. The microelectronic assembly of claim 16, wherein at least a portion of the second conductive plate is moveable between first and second positions such that the distance between the first and second conductive plates is a first distance when the second conductive plate is in the first position and a second distance when the second conductive plate is in the second position.

18. The microelectronic assembly of claim 17, wherein the at least one semiconductor device comprises an integrated circuit formed over the substrate, the integrated circuit being configured to generate a signal representative of a first capacitance when the second conductive plate is in the first position and a second capacitance when the second conductive plate is in the second position.

19. The microelectronic assembly of claim 16, wherein a gap is defined between the conductive shield and the second conductive plate and further comprising first and second conductive shield members formed on opposing sides of the conductive trace adjacent to the gap, the conductive shield members being electrically connected to the conductive shield.

20. The microelectronic assembly of claim 19, further comprising an electrically insulating material between the conductive trace and the conductive shield and within the gap between the conductive shield and the second conductive plate.

* * * * *